United States Patent
Pan et al.

[11] Patent Number: 6,069,059
[45] Date of Patent: May 30, 2000

[54] WELL-DRIVE ANNEAL TECHNIQUE USING PREPLACEMENT OF NITRIDE FILMS FOR ENHANCED FIELD ISOLATION

[75] Inventors: Pai-Hung Pan, Boise, Id.; Nanseng Jeng, Vancouver, Wash.

[73] Assignee: Micron Technology, Inc., Boise, Id.

[21] Appl. No.: 08/975,039

[22] Filed: Nov. 18, 1997

[51] Int. Cl.$^7$ ................................................. H01L 21/761
[52] U.S. Cl. ........................... 438/451; 438/220; 438/228
[58] Field of Search .................................... 438/225, 227, 438/228, 294, 297, 362, 439, 449, 451, 452, 218–221, 223–224

[56] References Cited

U.S. PATENT DOCUMENTS

| | | | |
|---|---|---|---|
| 5,043,778 | 8/1991 | Teng et al. ............................. | 257/374 |
| 5,296,400 | 3/1994 | Park et al. ............................. | 438/253 |
| 5,497,021 | 3/1996 | Tada ..................................... | 257/369 |
| 5,516,710 | 5/1996 | Boyd et al. ............................ | 438/309 |
| 5,627,099 | 5/1997 | Sasaki ................................... | 438/452 |
| 5,677,208 | 10/1997 | Itou et al. ............................. | 438/199 |
| 5,688,710 | 11/1997 | Lu ........................................ | 438/451 |
| 5,837,378 | 11/1998 | Mathews et al. .................... | 438/439 |
| 5,846,596 | 12/1998 | Shim et al. .......................... | 438/439 |

*Primary Examiner*—Olik Chaudhuri
*Assistant Examiner*—Anh Duy Mai
*Attorney, Agent, or Firm*—Trask, Britt & Rossa

[57] ABSTRACT

A method of forming an isolation structure comprising forming n-type areas and/or p-type areas implanted respectively therein on a first surface of the substrate. A pad oxide film is grown on the substrate first surface covering the p-wells and/or n-wells. A diffusion barrier(s) is deposited on the substrate first surface and a substrate second surface to form an encapsulated structure. The encapsulated structure is annealed to activate the n-type and/or p-type areas. A mask material is applied over the diffusion barrier on the substrate first surface to define active device areas and a dry etch process is used to etch away the unmasked portions of the diffusion barrier. The mask material is stripped and a field oxide is grown on the substrate first surface. A portion of the field oxide and all of the diffusion barrier is removed, resulting in active areas surrounded by a field isolation structure.

22 Claims, 14 Drawing Sheets

WELL-DRIVE ANNEAL TECHNIQUE USING PREPLACEMENT OF NITRIDE FILMS FOR ENHANCED FIELD ISOLATION

BACKGROUND OF THE INVENTION

1. Field of the Invention

The present invention relates to an apparatus and method for forming isolation structures for isolating electrical devices on a semiconductor substrate. More particularly, the present invention relates to forming the isolation structure using a novel LOCOS (LOCal Oxidation of Silicon) technique.

2. State of the Art

The fabrication of an electrical circuit involves connecting isolated electrical devices with specific electrical paths. For the sake of example only, the follow discussion will focus on the formation of a twin-well CMOS (Complementary Metal Oxide Semiconductor) structure. In the fabrication of a CMOS integrated circuit, the isolation structure for electrically isolating the electrical devices must be built onto or into the silicon wafer itself. The individual electrical devices are generally isolated using the LOCOS process. FIGS. 14 through 27 illustrate the LOCOS process which begins with a semiconductor substrate 202, such as a silicon wafer, having p-wells 204 and n-wells 206 formed thereon, as shown in FIG. 14. A layer of silicon dioxide 210, usually between about 20 and 50 nm thick is formed on an active surface 208 of the semiconductor substrate 202, as shown in FIG. 15. The silicon dioxide layer 210 may be formed by any known technique, including but not limited to: thermally growing the layer, CVD (chemical vapor deposition), and the like. The function of the silicon dioxide layer 210, also called pad or buffer oxide, is to lessen the stresses between the semiconductor substrate 202 and a subsequently deposited silicon nitride layer.

As shown in FIG. 16, after the formation of the silicon dioxide layer 210, a thick layer of silicon nitride 212, usually between about 100 and 200 nm thick, is deposited, generally by CVD, over the silicon dioxide layer 210 to function as an oxidation mask. Active areas are then defined with photolithographic and etch steps illustrated in FIGS. 17 through 23.

As shown in FIG. 17, a resist layer 214 is patterned on the silicon nitride layer 212 to protect all of the areas where active areas will be formed. The silicon nitride layer 212 is etched, usually by a dry etch, and the silicon dioxide layer 210 is then etched, usually with either a dry or wet etch, as shown in FIG. 18. FIG. 19 illustrates a top view of an exemplary resist layer pattern 220. As shown in FIG. 20, the resist layer 214 is removed and the isolation structure or field oxide 216 is then formed, usually thermally grown by wet oxidation at temperatures of about 1000° C. for between about 2 and 4 hours. As the field oxide 216 grows, some of the oxidation diffuses laterally which causes the field oxide 216 to grow under and lift edges 218 of the silicon nitride layer 212. FIG. 21 illustrates a top view of FIG. 20. The silicon dioxide layer 210 is shown in dashed lines for visual orientation. Area 222 is shown with a silicon nitride layer 212 removed (dashed line showing previous location) to show the encroachment of the field oxide 216. The field oxide 216 encroaches in direction 224 and, simultaneously, in direction 226. This encroachment will ultimately reduce the size of an active area to be formed (see FIG. 23). In fact, a resulting active area length can shrink severely (about >0.11 $\mu$m per side for an active area having a beginning length of about 1.5 $\mu$m) due to the encroachment. However, the shrinkage of a width of the active area is less sensitive. The active area width usually reduces only slightly (<0.04 $\mu$m per side for an active area having a beginning width of about 0.3 $\mu$m).

The silicon nitride layer 212 is then removed to expose the silicon dioxide layer 210, as shown in FIG. 22. The field dioxide 216 and silicon dioxide layer 210 are etched to remove the silicon dioxide layer 210 and expose the active areas 230 on the p-wells 204 and n-wells 206, as shown in FIG. 23.

The active areas 230 are then used to form individual electrical devices, such as PMOS, NMOS, and CMOS transistors. For purposes of illustration, FIGS. 24 through 27 show the formation of semiconductor-layer source and drain regions for a CMOS transistor. The source and drain regions are formed by introducing an impurity element into the semiconductor layer (see U.S. Pat. No. 5,514,879 issued May 7, 1996 to Yamazaki). Typically, the introduction of impurities for a CMOS transistor requires two masking and implantation steps. As shown in FIG. 24, spacers 232 are used to substantially bifurcate the active areas 230. As shown in FIG. 25, a first mask 234 is applied over the active areas 230 over the n-wells 206. An n-type impurity is introduced to the exposed active areas 230 over the p-wells 204 to form n-type areas 236. The first mask 234 is removed and a second mask 238 is applied to the active areas 230 over the p-wells 204, as shown in FIG. 26. A p-type impurity is introduced to the exposed active areas 230 over the n-wells 206 to form p-type area 240. The second mask 238 then is removed to form the fundamental CMOS structure 242, as shown in FIG. 27. The n-type areas 236 and the p-type areas 240 are subsequently used as source/drain areas in further CMOS fabrication.

The p-type and n-type impurities can be introduced by thermal diffusion or ion implantation. By using thermal diffusion, the impurities are introduced from the surface of the semiconductor layer. By using ion implantation, impurity ions are implanted into the semiconductor layer. The ion implantation method provides a more precise control with respect to the total impurity concentration and depth that the impurities can be implanted into the semiconductor layer, and thus allows impurities to be implanted into a shallow, thin film. However, since an ion implantation apparatus uses an ion beam having a diameter of only several millimeters, it is necessary to either move the substrate mechanically or scan the ion beam electrically over the substrate since the area of the substrate is larger than the diameter of the ion beam. Thus, an alternate technique is an ion shower-doping method. According to this technique, ions are generated by using a plasma discharge. The ions are dispersed in a cone shape and accelerated at a low voltage without mass separation to implant in the substrate.

Once the implantation is complete, the CMOS structure 242 is annealed at about 600° C. to activate the impurities. However, the temperature of annealing is detrimental to any temperature-sensitive portion of the entire structure. Furthermore, it is known that any metal contamination in the furnace/holder will out-diffuse and contaminate the semiconductor wafers containing the CMOS structures 242 during the high temperature anneal. In order to eliminate this problem, a highly clean furnace and wafer holders are required. It is also known that any metal contamination in any individual semiconductor wafer will contaminate other nearby semiconductor wafers in the same batch during high temperature anneal.

Therefore, it would be advantageous to develop an electrical device isolation technique which substantially eliminates the aforementioned contamination effects and reduces encroachment of the field oxide into the active areas, while using inexpensive, commercially-available, widely-practiced semiconductor device fabrication techniques and apparatus.

SUMMARY OF THE INVENTION

The method of the present invention begins with a substrate of semiconductor material, such as monocrystalline silicon (traditional silicon wafer), silicon-on-glass, or silicon-on-sapphire, germanium, or ceramic, having a first surface and an opposing second surface. The substrate first surface is processed to form n-type areas and/or p-type areas implanted respectively therein. A pad oxide film is grown on the substrate first surface by any known technique. A diffusion barrier is deposited over the pad oxide film, using any known deposition technique. A diffusion barrier may also be formed over the substrate second surface to form an encapsulated structure. It is understood that the diffusion barrier layer can be applied in two steps (i.e., application to the substrate first surface and the substrate second surface, separately) and can constitute different substances covering the substrate first substrate and the substrate second substrate. The resulting structure is annealed to activate the n-type and/or p-type areas.

A mask material is applied on the diffusion barrier layer covering the substrate first surface, by any known masking technique, and the diffusion barrier layer is etched to define active device areas. The mask material is stripped and a field oxide is grown on the exposed substrate first surface. A portion of the field oxide and all of the diffusion barrier is removed, resulting in active areas surrounded by a field isolation structure.

By forming and activating (by annealing) the n-type and p-type areas within the p-wells and n-wells prior to the formation of the field isolation structure around the active areas, the encroachment of the field isolation structure is substantially reduced. Furthermore, the encapsulation of the substrate prior to annealing virtually eliminates the potential of any metal contamination in the furnace/holder which may out-diffuse during annealing from contaminating the substrate.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

FIGS. 1 through 8 illustrate, in cross-section, a method for forming isolation structures for isolating electrical devices on a semiconductor substrate. It should be understood that the figures presented in conjunction with this description are not meant to be actual cross-sectional views of any particular portion of an actual semiconductor device, but are merely idealized representations which are employed to more clearly and fully depict the process of the invention than would otherwise be possible.

Figure 1:
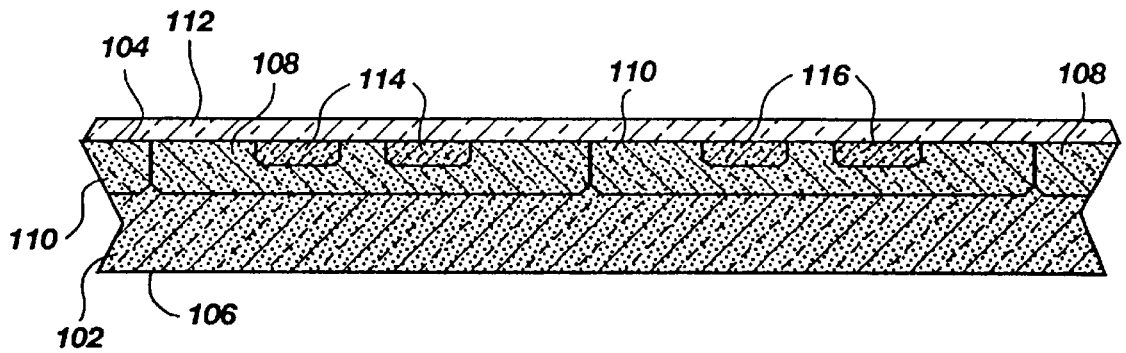
FIGS. 1–8 are cross-sectional views of a method of the present invention for forming a field isolation structure.

FIG. 1 illustrates a substrate 102 having a first surface 104 and an opposing second surface 106, and p-wells 108 and n-wells 110. A zero oxide 112 is grown on the substrate first surface 104. Zero alignment marks (not shown) are defined and n-type areas 116 and p-type areas 114 are implanted in the n-wells 108 and p-wells 110. The implantation of the n-wells 108 and the p-wells 110 may be accomplished by known implantation techniques, such as thermal diffusion, ion implantation, ion shower, and doping (as discussed above). After implantation, the substrate 102 is cleaned and the zero oxide 112 stripped.

Figure 2:
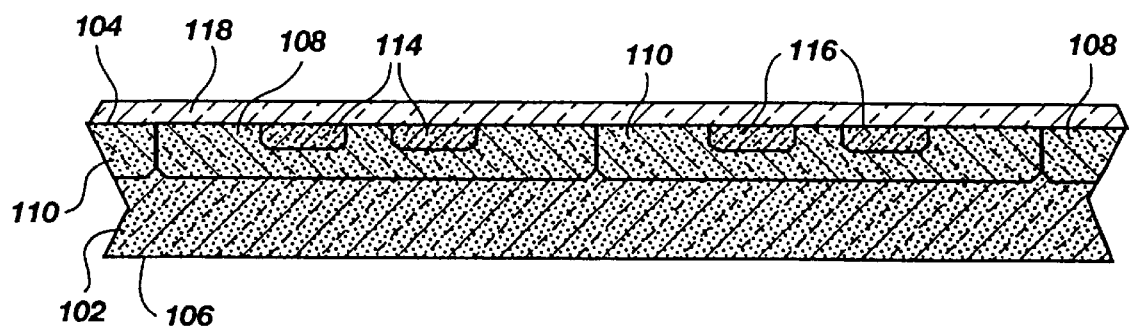

As shown in FIG. 2, a pad oxide film 118 is grown, preferably by thermal oxidation, on substrate first surface 104. Preferably, the pad oxide film 118 is grown to a depth of between about 50 Å–300 Å. Most preferably, the pad oxide film 118 is grown to a depth of about 80 Å at about 800° C. to 950° C. in an $O_2$ or $H_2O/O_2$ ambient atmosphere. It is, of course, understood that the zero oxide 112 may serve as the pad oxide by eliminating the zero oxide stripping and pad oxide film growing steps.

Figure 3:
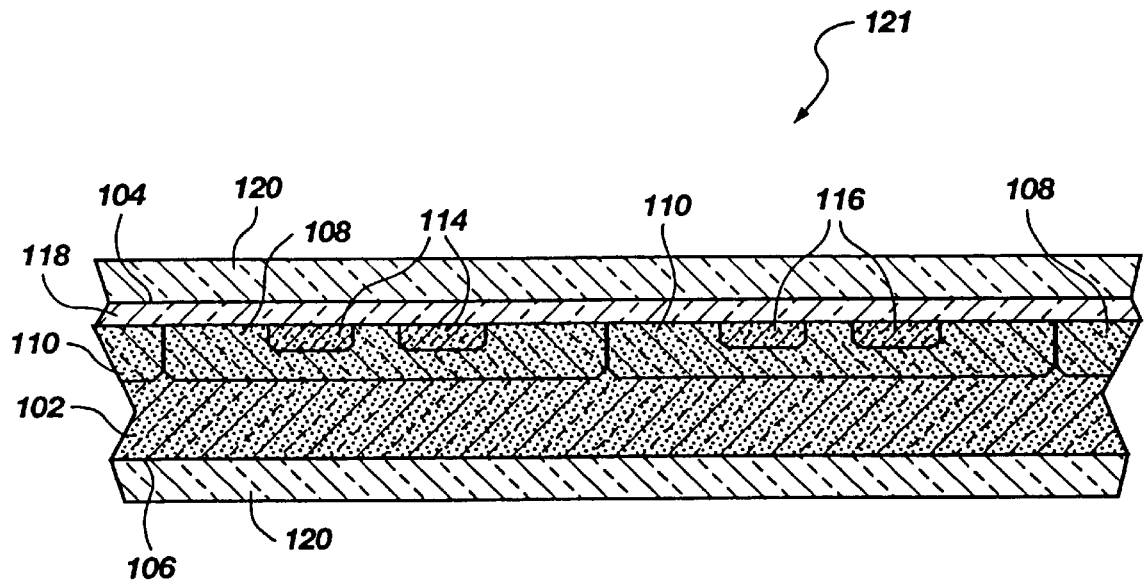

As shown in FIG. 3, a diffusion barrier layer 120, such as silicon nitride or silicon oxynitride, is deposited on the substrate first surface 104 and the substrate second surface 106, preferably to a depth of between about 1000 Å and 2500 Å, using any known deposition technique, such as chemical vapor deposition ("CVD") or low pressure chemical vapor deposition ("LPCVD"), to form an encapsulated structure 121. The diffusion barrier layer 120 is most preferably formed to a depth of about 2000 Å using LPCVD ($NH_3/SiH_2Cl_2$ vapor).

The encapsulated structure 121 is annealed at a temperature ranging from between about 900° C. and 1150° C. in an ambient atmosphere of inert gas (such as $N_2$, Ar, or Ne), an oxidant gas (such as $O_2$, $H_2O$, or $CO_2$), or a mixture of inert gas and oxidant gas to activate the p-type areas 114 and the n-type areas 116. It is, of course, understood that for an entirely encapsulated structure 121 the ambient atmosphere during annealing is of no consequence. However, if a portion of a structure (e.g., the backside) is not encapsulated, the ambient atmosphere may have to be carefully selected.

The formation of the encapsulated structure 121 prior to annealing virtually eliminates any potential for metal contamination of the semiconductor wafer, since any metal contaminant in the annealing furnace and/or holder which out-diffuses cannot contact any surface of the substrate 102. Furthermore, annealing early in the fabrication process eliminates the possibility of damage to temperature-sensitive portions of the finished device, such as threshold voltage and junction depths, as these portions are formed after the annealing.

Figure 4:
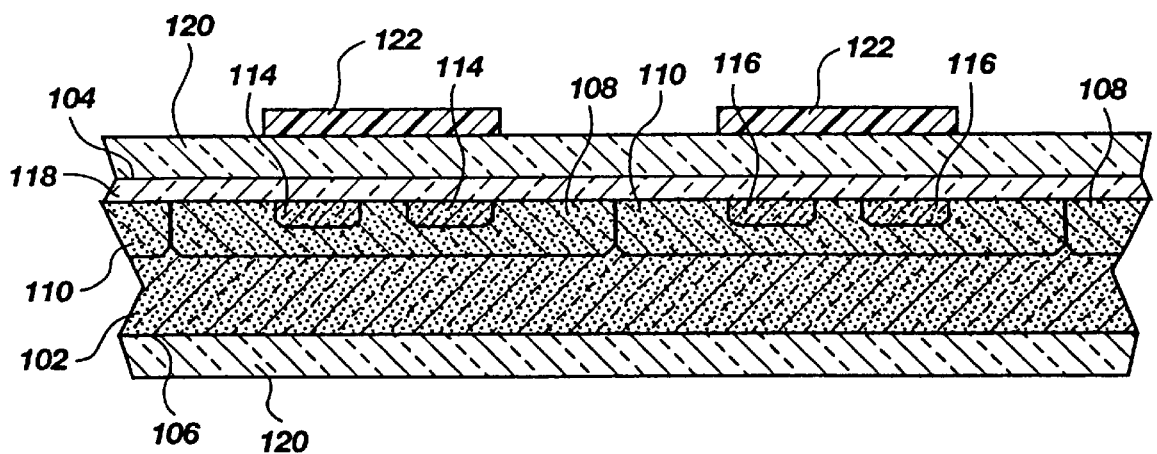

As shown in FIG. 4, after the high temperature anneal, a photo mask material 122 is applied, by any known masking technique (such as photolithography or the like), to define active device areas 124. A hydrofluoric acid dip may be needed before applying the photo mask material 122 to achieve good adhesion of the photo mask material 122.

Figure 5:
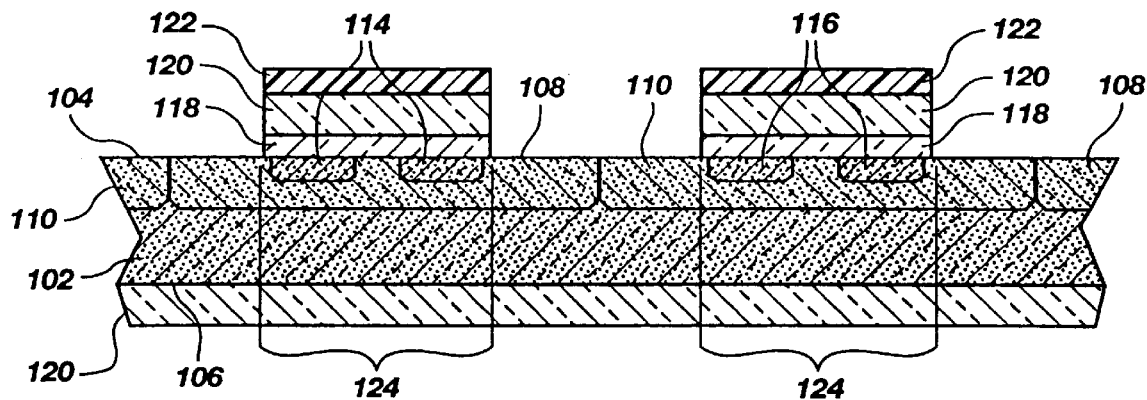
Figure 6:
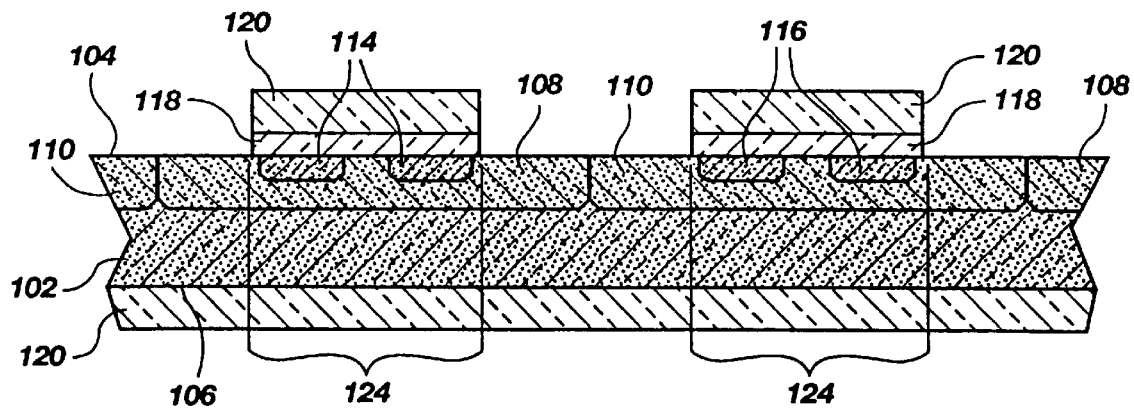

As shown in FIG. 5, a dry etch process is used to define the active device areas 124. The dry etch is preferably a reactive ion etch (RIE) at a power of between about 600 watts and 900 watts (most preferably about 800 watts) and a pressure of between about 3000 mTorr and 6000 mTorr (most preferably about 4500 mTorr). As shown in FIG. 6, the photo mask material 122 is stripped, preferably using a plasma $O_2$ method, and the substrate 102 is cleaned, preferably using a standard RCA cleaning.

Figure 7:
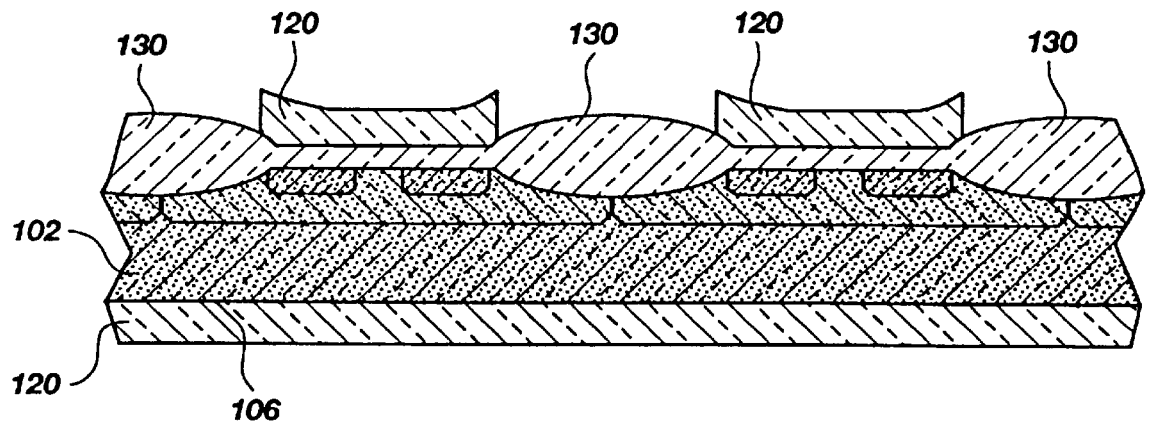
Figure 8:
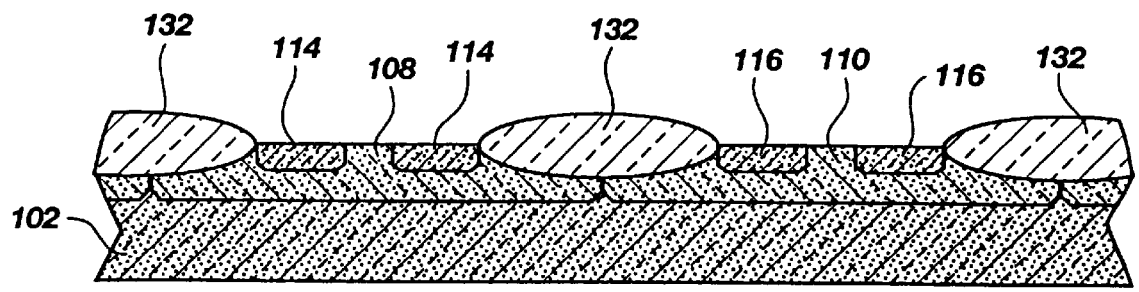

As shown in FIG. 7, a field oxide 130 is grown on the substrate first surface 104. The field oxide 130 is preferably grown at about 1050° C. in an $H_2O/O_2$ ambient atmosphere to a thickness of between about 2000 Å and 3500 Å, preferably about 2500 Å. Approximately 100 Å of field oxide is remove with hydrofluoric acid and the diffusion barrier layer 120 is removed in hot (about 150° C.) phosphoric acid for about 50 minutes which results in the field isolation structure 132, as shown in FIG. 8.

Figure 9:
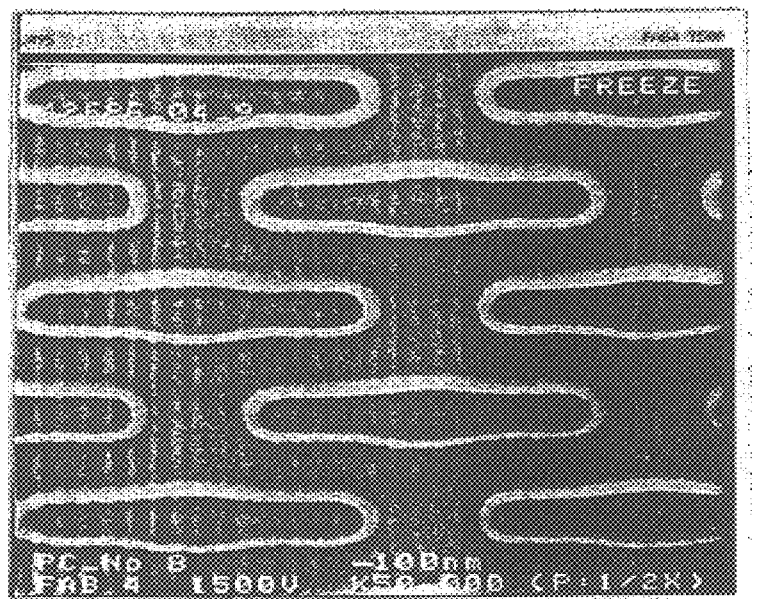
FIGS. 9–10 are scanning electron micrographs of field isolation structures formed according to the present invention.
Figure 10:
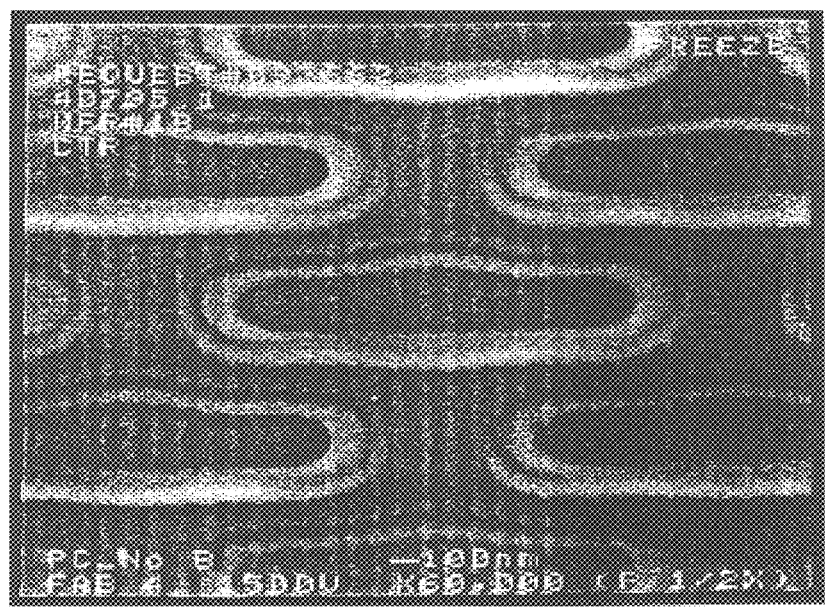

Scanning electron micrographs of active areas formed by prior art techniques and by the present invention are shown in FIGS. 9–12. Each of the active areas (dark ovals) shown in FIGS. 9–12 was formed using the technique of the present invention with a pad oxide deposited to a depth of about 130 Å and a pad nitride film deposited to a depth of about 1900 Å. FIGS. 9 and 10 show top plan views of substrates having a plurality of active areas (dark ovals) after the formation of the field isolation structures (dark area surrounding the active areas), as illustrated in FIG. 8, by a method of the present invention. FIG. 9 shows active areas on a substrate at the ACI (After Clean Inspection) step after the device has been etched and cleaned, but prior to annealing. The band which surrounds the active areas (light-toned band between the field isolation structure and the active areas) indicates the amount of encroachment of field isolation structure into the active area during the formation thereof. FIG. 10 shows the resulting active area on a substrate with annealing the substrate in a nitrogen atmosphere at about 1082° C. for approximately 180 minutes prior to the formation of the isolation structure.

Figure 11:
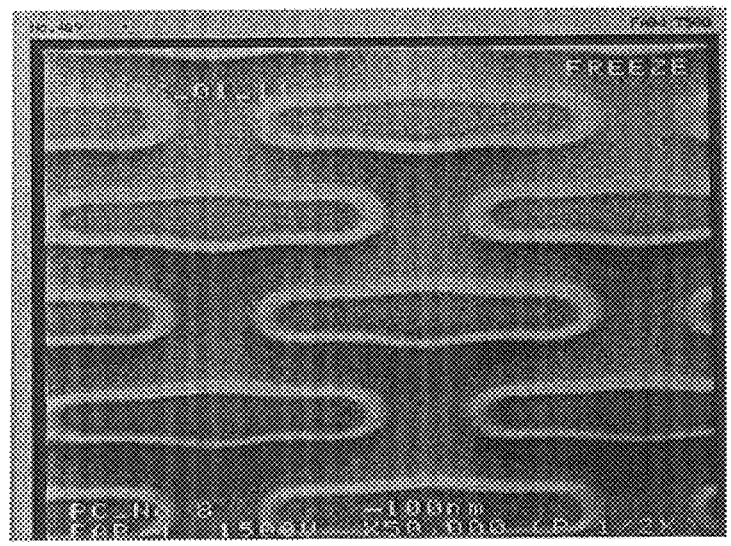
FIGS. 11–12 are scanning electron micrographs of field isolation structures formed by a prior art technique.
Figure 12:
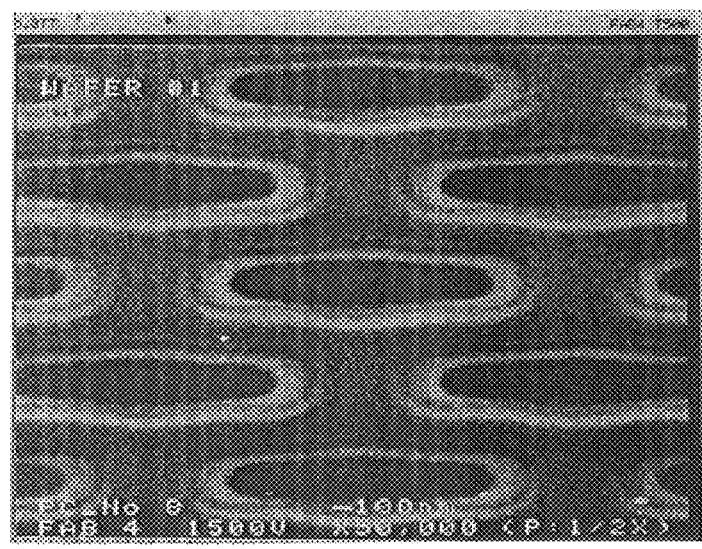

FIGS. 11 and 12 illustrate the resulting active areas in a substrate using the prior art fabrication method illustrated in FIGS. 14 through 27 without annealing the substrate prior to forming the field isolation structure. Again, the dark ovals indicate the resulting active areas, the dark area surrounding the active areas, and the lighttoned bands encircling the active areas indicate the amount of encroachment of field isolation structure into the active area during the formation thereof. FIG. 11 shows active areas on a substrate at the ACI (After Clean Inspection) step after the device has been etched and cleaned, but prior to annealing. FIG. 12 shows the resulting active areas in a substrate without annealing the substrate at about 1082° C. for approximately 180 minutes.

By comparing resulting active areas formed by the method of the present invention, as shown by FIGS. 9 and 10, against the method of the prior art, as shown by FIGS. 11 and 12, it can be seen that the field isolation structure encroachment is significantly less using the method of the present invention. Although the precise mechanism is not known, it is believed that the densification of the substrate resulting from the annealing prior to the formation of the isolation structure reduces the encroachment of the isolation structure. Another possible mechanism is that the nitrogen in the diffusion barrier layer 120, when nitrogen containing substances such as silicon nitride or silicon oxynitride are used for such a diffusion barrier, reacts with the pad oxide film 118 and the by-products formed therefrom reduce the encroachment of the isolation structure.

Figure 13:
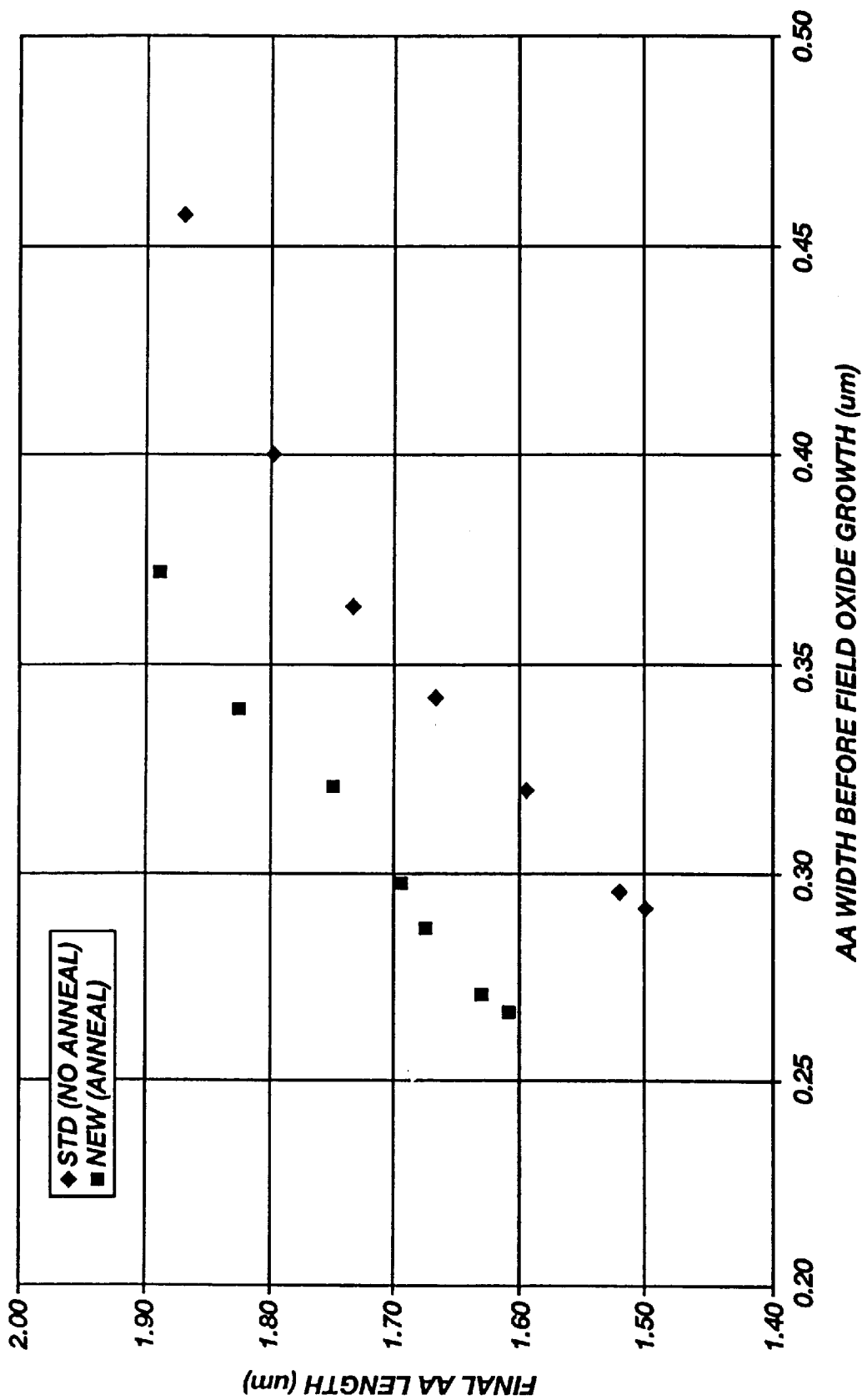
FIG. 13 is a graph comparing the difference in field isolation structure encroachment in the terms of active area length v. active area width for annealed and unannealed substrates.
Figure 14:
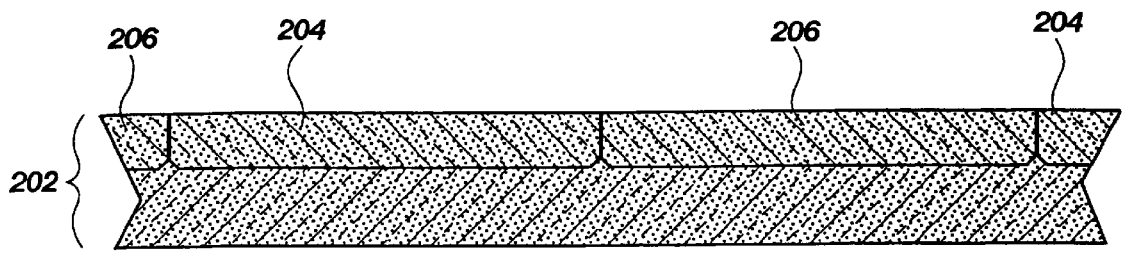
FIGS. 14–27 are cross-sectional views of a prior art technique for forming a field isolation structure.
Figure 15:
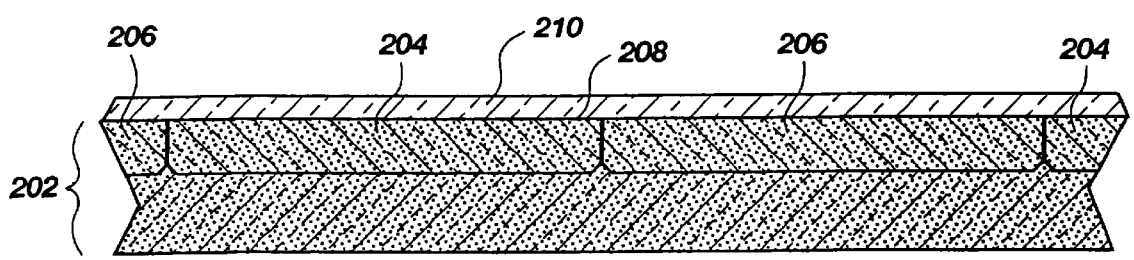
Figure 16:
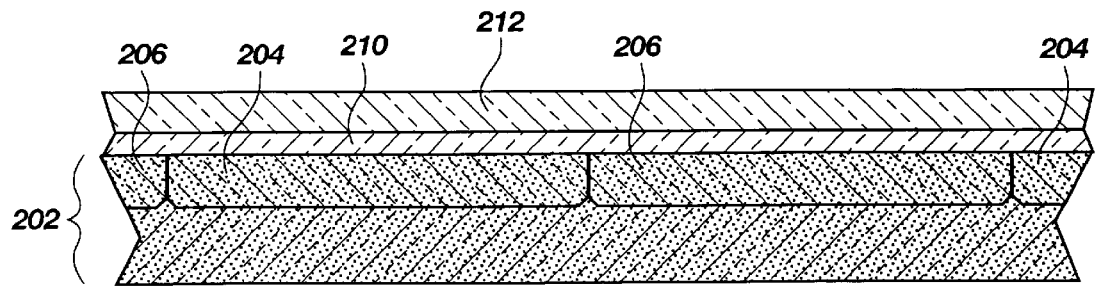
Figure 17:
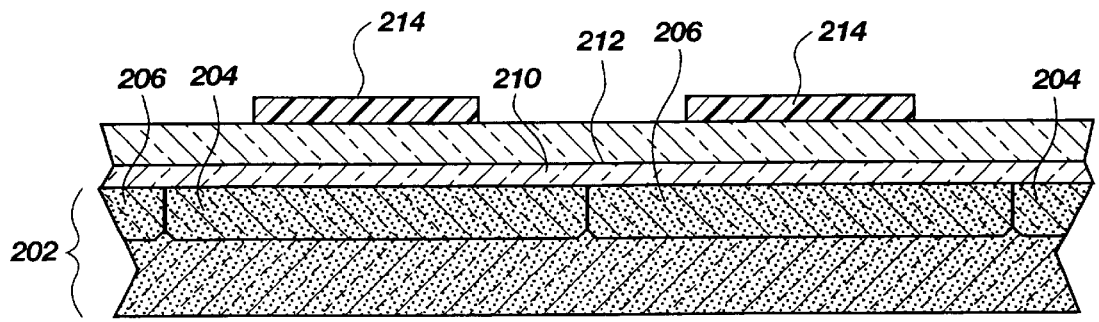
Figure 18:
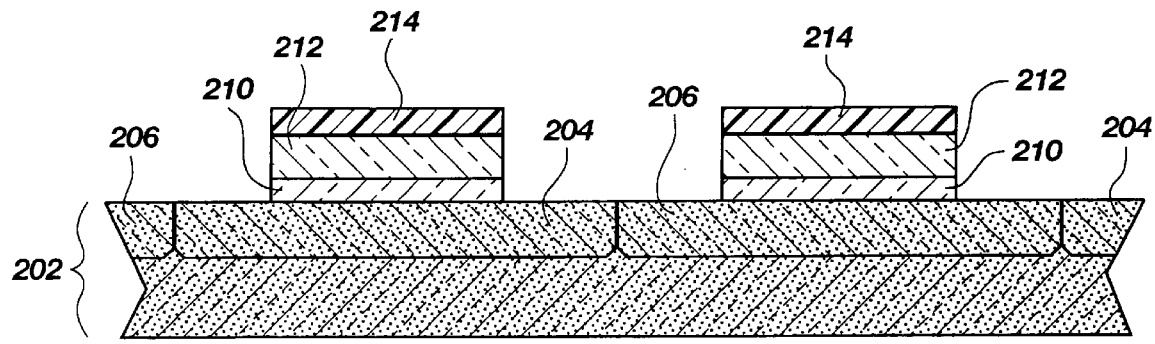
Figure 19:
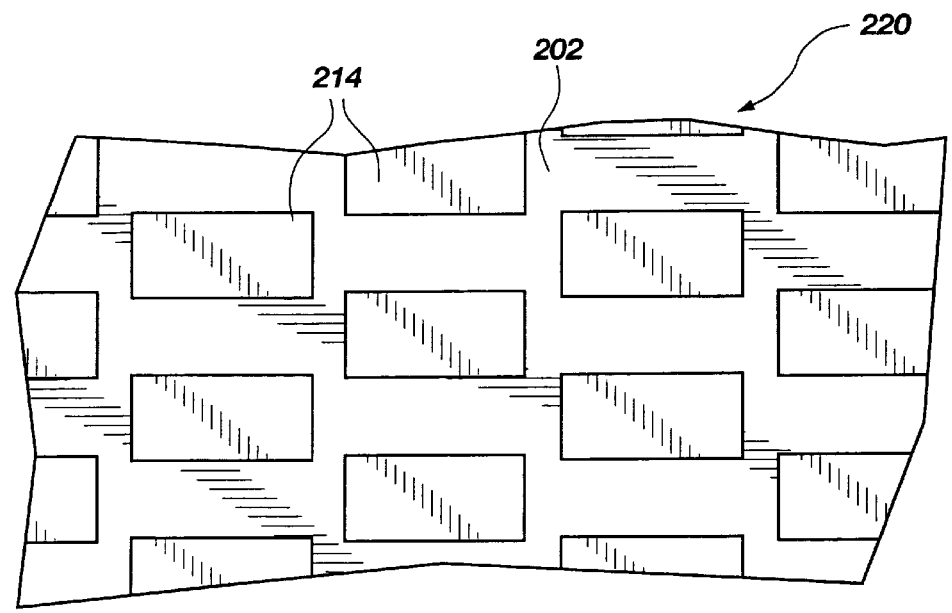
Figure 20:
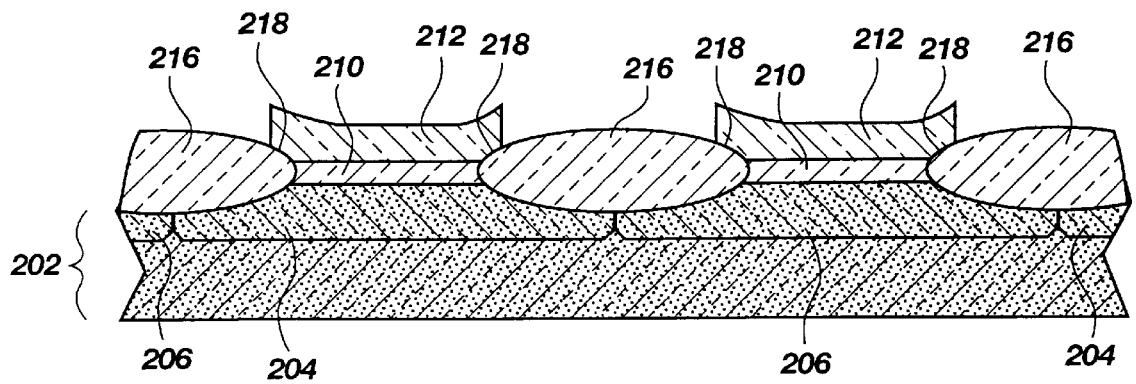
Figure 21:
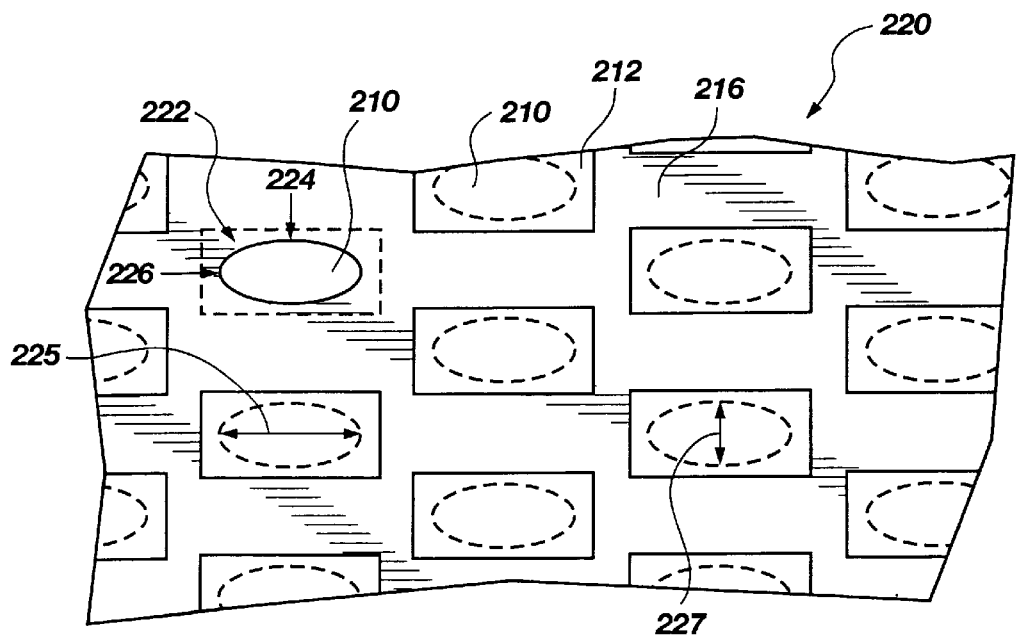
Figure 22:
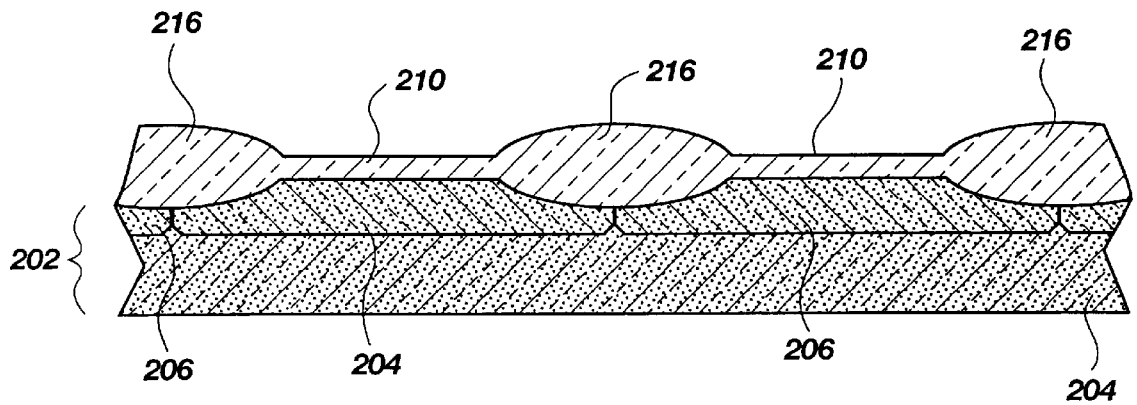
Figure 23:
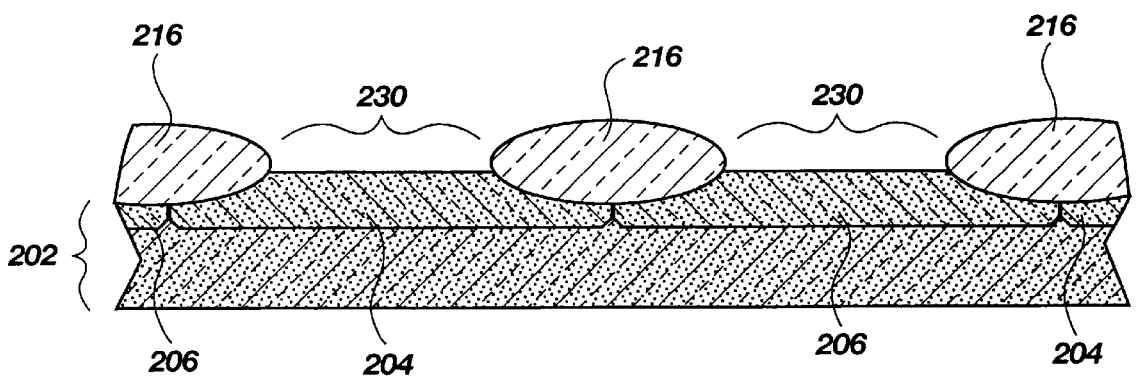
Figure 24:
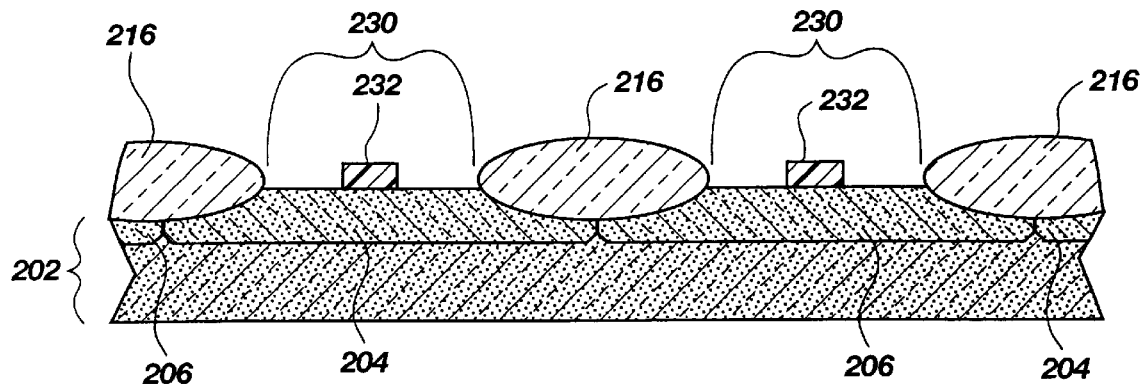
Figure 25:
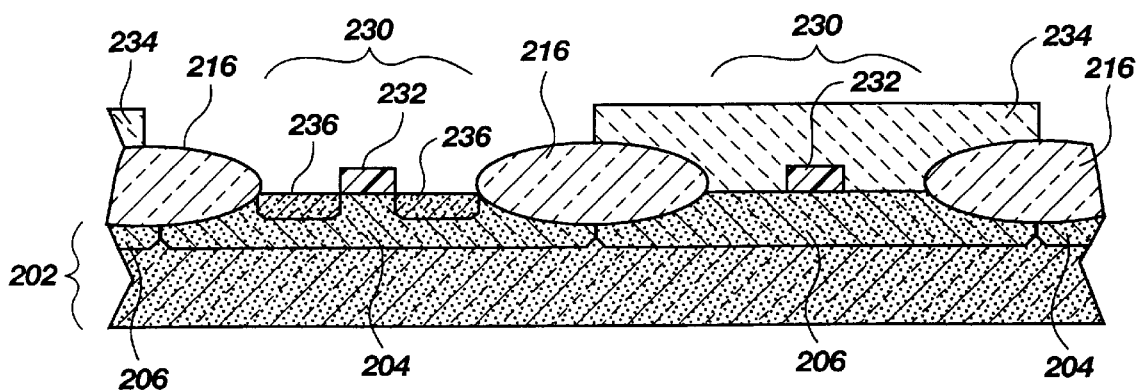
Figure 26:
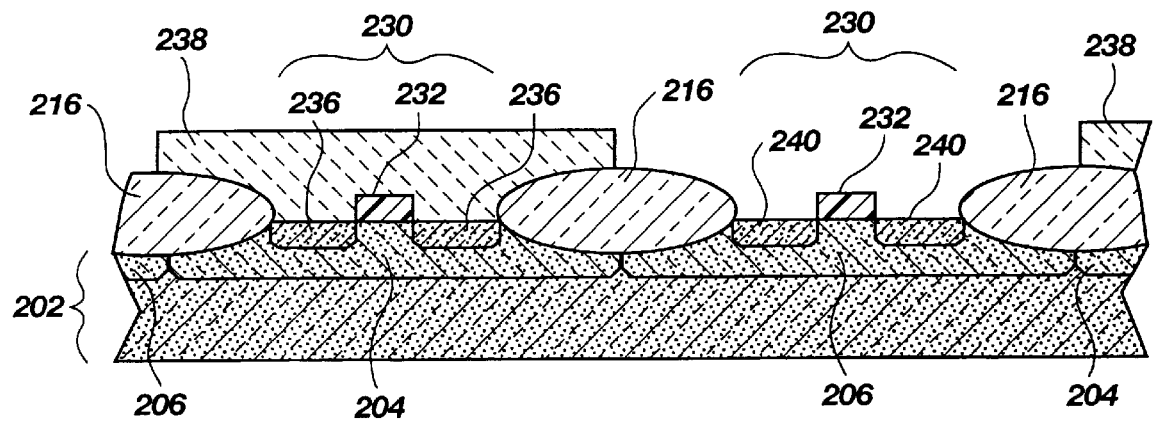
Figure 27:
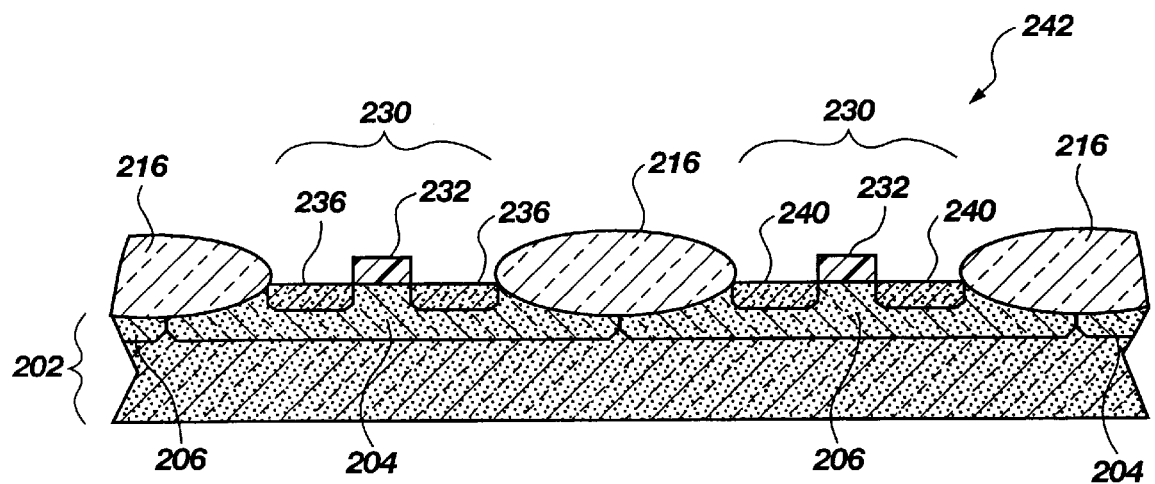

The decrease in encroachment of the isolation structure is can also be seen in the graph illustrated in FIG. 13. This graph shows the final active area ("AA") length after field oxide growth graphed in relation to the active area ("AA") width before field isolation structure (field oxide) growth for silicon wafers, with and without anneal prior to the formation of the field oxide. Active areas with the same AA width before field oxide growth will have the same AA length before field oxide growth. However, the final AA length depends strongly on the process technology used, e.g., a better process provides a longer final AA length. Thus, it can be seen from FIG. 13 that the present invention reduces field oxide encroachment and results in a longer active area (approximately 20–25% longer).

Although the present disclosure is focus on the formation of a CMOS structure, it is, of course, understood that the above described technique can be used to form any MOS structure such as NMOS structures or PMOS structures, or any semiconductor structure using a LOCOS-type field isolation structure.

Having thus described in detail preferred embodiments of the present invention, it is to be understood that the invention defined by the appended claims is not to be limited by particular details set forth in the above description, as many apparent variations are possible without departing from the spirit or scope thereof.

What is claimed is:

1. A method of forming elements of isolated electrical devices on a semiconductor substrate comprising:

providing a semiconductor substrate having a first surface, a second surface, at least one p-well, and at least one n-well;

forming a zero oxide layer over said first surface;

creating at least one p-type area within said at least one n-well and at least one n-type area within said at least one p-well after formation of said zero oxide layer;

substantially removing said zero oxide layer from said first surface;

forming a pad oxide layer over said first surface after substantially removing said zero oxide layer;

depositing a diffusion barrier layer over said pad oxide layer; and annealing said substrate to create at least one activated p-type area and at least one activated n-type area after deposition of the diffusion barrier layer.

2. The method of claim 1, wherein depositing said diffusion barrier layer over said pad oxide layer includes depositing said diffusion barrier layer over said substrate second surface.

3. The method of claim 1, further comprising depositing a second diffusion barrier layer over said substrate second surface.

4. The method of claim 1, wherein said step of depositing a diffusion barrier layer over said pad oxide layer comprises depositing a silicon nitride diffusion barrier layer over said pad oxide layer.

5. The method of claim 1, wherein said step of depositing a diffusion barrier layer over said pad oxide layer comprises depositing a silicon oxynitride diffusion barrier layer over said pad oxide layer.

6. The method of claim 1, further comprising:

applying a mask material over said diffusion barrier layer after annealing said substrate to create said at least one activated p-type area and said at least one activated n-type area;

etching said diffusion barrier layer to define at least one active device area comprised of said at least one activated n-type area or said at least one activated p-type area;

stripping said mask material;

growing a field oxide on said substrate; and removing said diffusion barrier layer and a portion of said field oxide to expose portions of said substrate first surface.

7. A method of forming elements of a MOS structure, comprising:

providing a semiconductor substrate having a first surface, a second surface, at least one p-well, and at least one n-well;

forming an oxide layer over said first surface;

creating at least one doped area within said at least one p-well or within said at least one n-well;

depositing a diffusion barrier layer over said oxide layer after said creation of said at least one doped area; and annealing said substrate to create at least one activated doped area after deposition of said diffusion barrier layer.

8. The method of claim 7, wherein depositing said diffusion barrier layer over said oxide layer includes depositing said diffusion barrier layer over said substrate second surface.

9. The method of claim 7, further comprising depositing a second diffusion barrier layer over said substrate second surface.

10. The method of claim 7, wherein said step of creating at least one doped area within said at least one p-well or within said at least one n-well comprises creating at least one area doped with a p-type impurity within said at least one n-well.

11. The method of claim 7, wherein said step of creating at least one doped area within said at least one p-well or within said at least one n-well comprises creating at least one area doped with an n-type impurity within said at least one p-well.

12. The method of claim 7, wherein said step of depositing a diffusion barrier layer over said oxide layer comprises depositing a silicon nitride diffusion barrier layer over said oxide layer.

13. The method of claim 7, wherein said step of depositing a diffusion barrier layer over said oxide layer comprises depositing a silicon oxynitride diffusion barrier layer over said oxide layer.

14. The method of claim 9, further comprising:

applying a mask material over said diffusion barrier layer after annealing said substrate to create said at least one activated doped area;

etching said diffusion barrier layer to define at least one active device area comprised of said at least one activated doped area;

stripping said mask material;

growing a field oxide on said substrate; and removing said diffusion barrier layer and a portion of said field oxide to expose portions of said substrate first surface.

15. A well-drive anneal method using preplacement of nitride films for enhanced field isolation comprising:

providing a semiconductor substrate having a first surface and a second surface;

forming an oxide layer over said first surface;

creating at least one doped area on said first surface;

depositing a diffusion barrier layer over said oxide layer after creation of said at least one doped area; and annealing said substrate to create at least one activated doped area after deposition of said diffusion barrier layer.

16. The method of claim 15, wherein depositing said diffusion barrier layer over said oxide layer includes depositing said diffusion barrier layer over said substrate second surface.

17. The method of claim 15, further comprising depositing a second diffusion barrier layer over said substrate second surface.

18. The method of claim 15, wherein said step of creating at least one doped area on said first surface comprises doping at least one area on said first surface with a p-type impurity.

19. The method of claim 15, wherein said step of creating at least one doped area on said first surface comprises doping at least one area on said first surface with an n-type impurity.

20. The method of claim 15, wherein said step of depositing a diffusion barrier layer over said oxide layer after creation of said at least one doped area comprises depositing a silicon nitride diffusion barrier layer.

21. The method of claim 15, wherein said step of depositing a diffusion barrier layer over said oxide layer after creation of said at least one doped area comprises depositing a silicon oxynitride diffusion barrier layer.

22. The method of claim 17, further comprising:

applying a mask material over said diffusion barrier layer after annealing said substrate to create said at least one activated doped area;

etching said diffusion barrier layer to define at least one active device area comprised of said at least one activated doped area;

stripping said mask material;

growing a field oxide on said substrate; and removing said diffusion barrier layer and a portion of said field oxide to expose portions of said substrate first surface.

* * * * *

UNITED STATES PATENT AND TRADEMARK OFFICE
CERTIFICATE OF CORRECTION

PATENT NO.   : 6,069,059
DATED        : May 30, 2000
INVENTOR(S)  : Pai-Hung Pan and Nanseng Jeng It is certified that error appears in the above-identified patent and that said Letters Patent is hereby corrected as shown below:

Column 1,
Line 17, change "follow" to -- following --

Column 2,
Line 7, change "dioxide" to -- oxide --

Column 4,
Line 44, after "that" insert a comma -- , --
Line 45, after "121" insert a comma -- , --
Line 61, after "124" insert -- (see FIGS. 5 and 6) --

Column 5,
Line 8, after "104" insert -- (see FIGS. 5 and 6) --
Line 12, change "remove" to -- removed --
Line 42, change "lighttoned" to -- light-toned --
Line 65, after "structure" delete "is"

Column 6,
Line 14, change "is focus" to -- focuses --
Line 16, change "above described" to -- above-described --

Column 7,
Line 53, change "9" to -- 7 --

Column 8,
Line 41, change "17" to -- 15 --

Signed and Sealed this

Eighteenth Day of January, 2005

JON W. DUDAS
*Director of the United States Patent and Trademark Office*